(12) United States Patent
Bak

(10) Patent No.: US 12,349,491 B2
(45) Date of Patent: Jul. 1, 2025

(54) IMAGE SENSING DEVICE

(71) Applicant: SK hynix Inc., Icheon-si (KR)

(72) Inventor: Ho Jin Bak, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 423 days.

(21) Appl. No.: 17/156,468

(22) Filed: Jan. 22, 2021

(65) Prior Publication Data

US 2021/0366969 A1    Nov. 25, 2021

(30) Foreign Application Priority Data

May 25, 2020  (KR) ................ 10-2020-0062225

(51) Int. Cl.
*H10F 39/00*    (2025.01)
*H10F 39/18*    (2025.01)

(52) U.S. Cl.
CPC ....... *H10F 39/8067* (2025.01); *H10F 39/182* (2025.01); *H10F 39/8053* (2025.01); *H10F 39/8063* (2025.01); *H10F 39/807* (2025.01)

(58) Field of Classification Search
None
See application file for complete search history.

(56) References Cited

U.S. PATENT DOCUMENTS

| | | | |
|---|---|---|---|
| 9,263,485 B2 | 2/2016 | Furuta | |
| 10,236,315 B2 * | 3/2019 | Ooka | H10F 39/8063 |
| 10,276,616 B2 * | 4/2019 | Lin | H10F 39/8053 |
| 11,031,434 B2 * | 6/2021 | Tsao | H10F 39/199 |
| 11,081,514 B2 * | 8/2021 | Lee | H10F 39/014 |
| 2007/0023797 A1 | 2/2007 | Wu et al. | |
| 2013/0241018 A1 | 9/2013 | JangJian et al. | |
| 2016/0027822 A1 | 1/2016 | Ooka et al. | |

(Continued)

FOREIGN PATENT DOCUMENTS

| | | |
|---|---|---|
| CN | 109065563 A | 12/2018 |
| CN | 111048539 A | 4/2020 |

(Continued)

OTHER PUBLICATIONS

Office Action mailed Jan. 29, 2024, for Chinese Patent Application No. 202110053634.3, 13 pages with English translation.

(Continued)

*Primary Examiner* — Ali Naraghi
(74) *Attorney, Agent, or Firm* — Perkins Coie LLP

(57) ABSTRACT

An image sensing device may include an image sensing pixel array including a plurality of image sensing pixels operable to respond to light and to produce imaging pixel signals, and a first grid structure disposed between image sensing pixels to separate adjacent image sensing pixels. The image sensing pixel array is structured to include a center area located at or near a center of the image sensing pixel array, first and second diagonal edge areas disposed on opposite sides of the center area in a first diagonal direction, and third and fourth diagonal edge areas disposed on opposite sides of the center area in a second diagonal direction that is different from the first diagonal direction. The first grid structure includes a bent portion in at least one of the first to fourth diagonal edge areas to cover one vertex and adjacent parts of each image sensing pixel.

17 Claims, 12 Drawing Sheets

(56) References Cited

U.S. PATENT DOCUMENTS

| | | | |
|---|---|---|---|
| 2016/0155771 A1 | 6/2016 | JangJian et al. | |
| 2016/0276394 A1 | 9/2016 | Chou et al. | |
| 2016/0351605 A1 | 12/2016 | Yang | |
| 2017/0092671 A1 | 3/2017 | Yang | |
| 2019/0157329 A1* | 5/2019 | Kim | H10F 39/8053 |

FOREIGN PATENT DOCUMENTS

| | | |
|---|---|---|
| JP | 2017108062 A | 6/2017 |
| KR | 20160139266 A | 12/2016 |
| KR | 10-2019-0057601 A | 5/2019 |

OTHER PUBLICATIONS

Written Opinion for Korean Patent Application No. 10-2020-0062225, mailed on May 23, 2024, 13 pages with English translation.

Second Office Action for Chinese Patent Application No. 202110053634.3, mailed on Jul. 15, 2024, 13 pages with English translation.

* cited by examiner

IMAGE SENSING DEVICE

CROSS-REFERENCES TO RELATED APPLICATION

The present application claims the priority and benefits of Korean application number 10-2020-0062225, filed on May 25, 2020, which is incorporated herein by reference in its entirety as part of the disclosure of this patent document.

TECHNICAL FIELD

The technology and implementations disclosed in this patent document generally relate to an image sensing device.

BACKGROUND

An image sensor is a semiconductor device for capturing and converting light of optical images into electrical signals for displaying the captured images and for further processing of the captured images. The development of various industries and sectors, including computer, automotive, medical and communication industries generates various demands for advanced image sensors in various devices and systems such as a smart phone, digital camera, game machine, IOT (Internet of Things), robot, security camera and medical micro camera.

One common type of image sensing devices is a charge coupled device (CCD), which has dominated the field of image sensors for a long time. Another common type of image sensing device is a complementary metal oxide semiconductor (CMOS) image sensing device. CCD image sensors have advantages over the CMOS image sensor in terms of noise characteristics and image quality. However, CMOS image sensors are now widely used due to certain advantages over the CCD counterparts, including, e.g., higher frame rates and shutter speed. In addition, CMOS image sensors and signal processing circuitry can be integrated into a single chip, making it possible to miniaturize electronic devices while achieving low power consumption. Furthermore, using the CMOS fabrication technology can result in reduction in the production costs. Such characteristics make CMOS image sensors better suited for implementations in mobile devices.

SUMMARY

The embodiments of the disclosed technology relate to image sensors including separate grid structures that can achieve uniform optical characteristics.

In an embodiment, an image sensing device may include an image sensing pixel array including a plurality of image sensing pixels operable to respond to light and to produce imaging pixel signals, and a first grid structure disposed between image sensing pixels to separate adjacent image sensing pixels. The image sensing pixel array is structured to include a center area located at or near a center of the image sensing pixel array, first and second diagonal edge areas disposed on opposite sides of the center area in a first diagonal direction, and third and fourth diagonal edge areas disposed on opposite sides of the center area in a second diagonal direction that is different from the first diagonal direction. The first grid structure includes a bent portion in at least one of the first to fourth diagonal edge areas to cover one vertex and adjacent parts of each image sensing pixel to separate the imaging pixel from adjacent image sensing pixels.

In another embodiment, an image sensing device may include an image sensing pixel array including an array of image sensing pixels to detect incident light to produce pixel signals representing an image carried by the incident light, a lens placed relative to the image sensing pixel array to receive and direct incident light to the image sensing pixel array for detection, and isolation structures disposed between adjacent image sensing pixels of the image sensing pixel array, each isolation structure structured to include a portion filled with air to provide optical isolation between adjacent image sensing pixels. The isolation structures located in a central region of the image sensing pixel array around an optic axis of the lens are symmetrically located on four sides of each image sensing pixel. The isolation structures located in a peripheral region of the image sensing pixel array away from the optic axis of the lens include bent isolation structures that cover one vertex of each image sensing pixel that is the furthest away from the optic axis of the lens and portions of adjacent sides of the vertex.

In another embodiment, an image sensing device may include a pixel array including a plurality of pixels and a first grid structure including an air layer disposed between pixels adjacent to each other among the plurality of pixels and filled with air, wherein the pixel array comprises a center area located in the center of the pixel array, first and second diagonal edge areas disposed on both sides of the center area in a first diagonal direction, respectively, and third and fourth diagonal edge areas disposed on both sides of the center area in a second diagonal direction, respectively, wherein any one of the first to fourth diagonal edge areas comprises the L-shaped first grid structure to cover one vertex of the pixel.

In an embodiment, an image sensing device may include first grid structures disposed between adjacent pixels of a pixel array, and comprising an air layer filled with air, and second grid structures disposed between the first grid structures adjacent to each other, and configured to physically isolate the first grid structures, wherein the first grid structures are disposed on both sides of the pixel in the direction of the chief ray incident on pixels abutting on the first grid structures.

Based on the present embodiments, it is possible to not only secure the stability of the separate grid structures, but also guarantee optic uniformity in the entire pixel array.

In addition, it is possible to provide various effects which can be directly or indirectly determined through this document.

DETAILED DESCRIPTION

Hereafter, various embodiments will be described with reference to the accompanying drawings. However, it should be understood that this patent document is not limited to specific embodiments, but various modifications, equivalents and/or alternatives of the embodiments are included.

Figure 1:
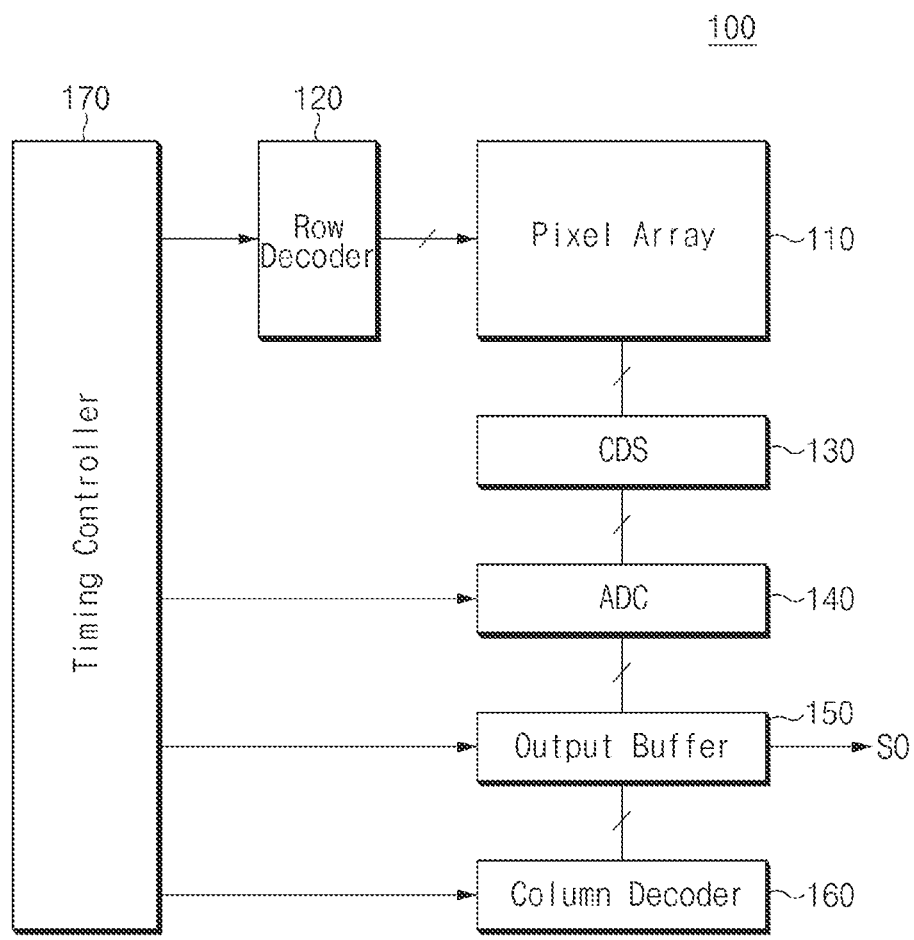
FIG. 1 is a block diagram illustrating an image sensor based on an embodiment of the disclosed technology.

FIG. 1 is a block diagram illustrating an image sensor based on an embodiment of the disclosed technology.

Referring to FIG. 1, the image sensor 100 may include a pixel array 110, a row decoder 120, a CDS (Correlate Double Sampler) 130, an ADC (Analog-Digital Converter) 140, an output buffer 150, a column decoder 160 and a timing controller 170. The components of the image sensor 100 are only examples, and at least some components may be added or omitted, if necessary.

The pixel array 110 may include a plurality of unit pixels arranged in a 2D matrix array. The plurality of unit pixels may convert an optical signal into an electrical signal on a unit pixel basis or a pixel group basis, where unit pixels in a pixel group share internal circuitry. The pixel array 110 may receive a driving signal, including a row selection signal, a pixel reset signal and a transmission signal, from the row decoder 120. The pixel array 110 may be activated in response to the driving signal.

The row decoder 120 may activate the pixel array 110 based on control signals from the timing controller 170. Specifically, the row decoder 120 may select one or more rows of the pixel array 110. The row decoder 120 may generate a row selection signal to select one or more rows among the plurality of rows. The row decoder 120 may sequentially enable the pixel reset signal and the transmission signal for pixels corresponding to the selected one or more rows. Thus, reference signals and image signals, which are analog signals generated by the pixels of the selected one or more rows, may be sequentially transferred to the CDS 130. The reference signals and the image signals may be collectively referred to as pixel signals. The reference signal may be an electrical signal corresponding to the state in which a sensing node within a pixel (i.e. floating diffusion node) is reset, and the image signal may be an electrical signal corresponding to the state in which photocharges are accumulated in the sensing node.

The CDS 130 may sequentially sample and hold the reference signals and the image signals, which are provided to a plurality of column lines from the pixel array 110, respectively. That is, the CDS 130 may sample and hold the voltage levels of the reference signals and the image signals which correspond to the respective columns of the pixel array 110.

The CDS 130 may transfer the reference signals and the image signals of the respective columns as CDS signals to the ADC 140 based on control signals from the timing controller 170.

The ADC 140 may convert the CDS signals for the respective columns, outputted from the CDS 130, into digital signals and output the digital signals. The ADC 140 may perform a counting operation and a computing operation based on the CDS signals for the respective columns and a ramp signal provided from the timing controller 170, and thus in generating digital image data from the pixels, may eliminate or reduce the noise arising from the pixels such as unique reset noise of each pixel.

The ADC 140 may include a plurality of column counters assigned to the respective columns of the pixel array 110, and generate the image data by converting the CDS signals corresponding to the respective columns into digital signals using the column counters. According to another embodiment, the ADC 140 may include one global counter, and convert the CDS signals corresponding to the respective columns into digital signals using a global code provided from the global counter.

The output buffer 150 may capture the column-based image data provided from the ADC 140, and output the captured image data. The output buffer 150 may temporarily store the image data outputted from the ADC 140 based on control signals from the timing controller 170. The output buffer 150 may operate as an interface which compensates for a difference in the transfer rate or processing speed between the image sensor 100 and other devices.

The column decoder 160 may select a column of the output buffer 150 based on control signals from the timing controller 170, such that the image data which are temporarily stored in the selected column of the output buffer 150 are sequentially outputted. Specifically, the column decoder 160 may receive an address signal from the timing controller 170, generate a column selection signal based on the address signal, and select a column of the output buffer 150, such that the image data are outputted as an output signal SO from the selected column of the output buffer 150.

The timing controller 170 may control the row decoder 120, the ADC 140, the output buffer 150 and the column decoder 160.

The timing controller 170 may provide the row decoder 120, the column decoder 160, the ADC 140 and the output buffer 150 with a clock signal required for operations of the respective components of the image sensor 100, a control signal for timing control, and address signals for selecting a row or column. According to an embodiment, the timing controller 170 may include a logic control circuit, a phase lock loop (PLL) circuit, a timing control circuit, a communication interface circuit and the like.

Figure 2:
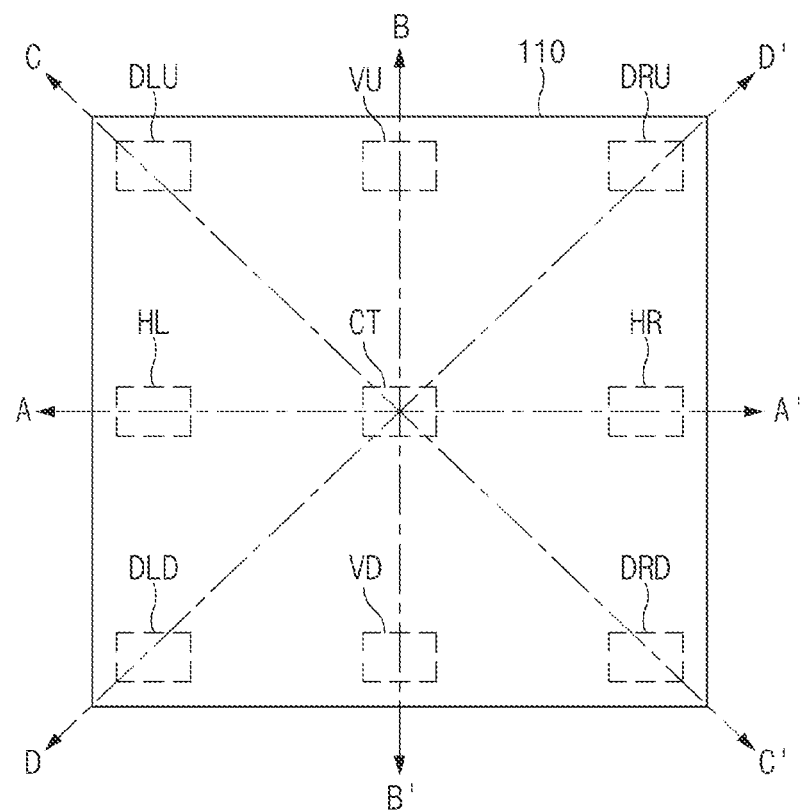
FIG. 2 is a diagram schematically illustrating an example of the pixel array of FIG. 1.

FIG. 2 is a diagram schematically illustrating an example of the pixel array of FIG. 1.

Referring to FIG. 2, the pixel array 110 may include a plurality of pixels arranged in a matrix array including a plurality of rows and a plurality of columns. The pixel array 110 may be divided into a plurality of areas depending on the relative locations of the areas in the pixel array 110.

The pixel array 110 may include a center area CT, a first horizontal edge area HL, a second horizontal edge area HR, a first vertical edge area VU, a second vertical edge area VD and first to fourth diagonal edge areas DLU, DRD, DLD and DRU. Each of the areas included in the pixel array 110 may include a predetermined number of pixels.

The center area CT may be located in the center of the pixel array 110.

The first and second horizontal edge areas HL and HR may be located at edges of the pixel array 110 on both sides of the center area CT along a horizontal line passing through the center area CT. In this patent document, the edge of the pixel array 110 may indicate an area including pixels located within a predetermined distance from a pixel located at the outermost part of the pixel array 110.

The first and second vertical edge areas VU and VD may be located at edges of the pixel array 110 on both sides of the center area CT along a vertical line passing through the center area CT.

The first diagonal edge area DLU may be located at an edge of the pixel array 110 on the left top side of the center area CT in a first diagonal direction passing through the center area CT. The first diagonal direction may indicate a direction set by rotating the horizontal line at a positive angle.

The second diagonal edge area DRD may be located at an edge of the pixel array 110 on the right bottom side of the center area CT in the first diagonal direction passing through the center area CT.

The third diagonal edge area DLD may be located at an edge of the pixel array 110 on the left bottom side of the center area CT in a second diagonal direction passing through the center area CT. The second diagonal direction may indicate a direction set by rotating the horizontal line at a negative angle.

The fourth diagonal edge area DRU may be located at an edge of the pixel array 110 on the right top side of the center area CT in the second diagonal direction passing through the center area CT.

Figure 3A:
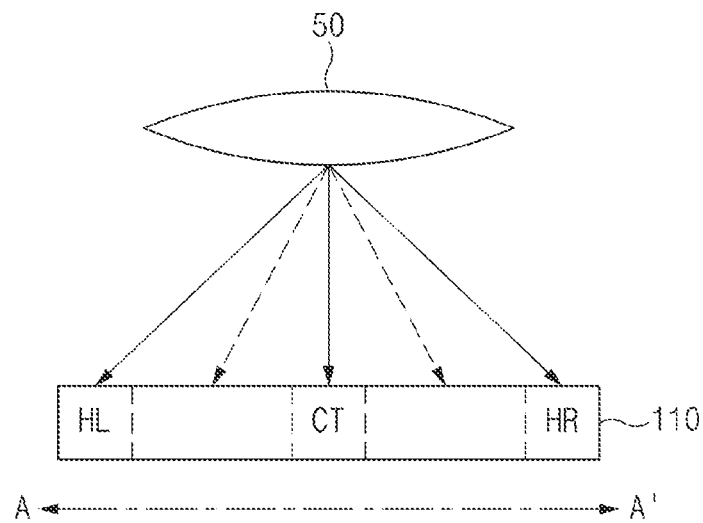
FIG. 3A is a diagram illustrating an example of light incident on the pixel array of FIG. 2.

FIG. 3A is a diagram illustrating an example of light incident on the pixel array of FIG. 2.

Referring to FIG. 3A, the image sensor 100 illustrated in FIG. 1 may further include an objective lens 50. The objective lens 50 may be disposed between the pixel array 110 and an object in front of the image sensor 100, and gather light from the object in front of the image sensor 100. The objective lens 50 may include one or more lenses aligned with an optical axis. The optical axis may pass through the center of the pixel array 110.

In some implementations, a chief ray can be defined as a light ray from an off-axis point in the object passing through the center of the aperture stop. Chief rays having passed through the objective lens 50 may be directed in a concentric direction around the optical axis. In FIG. 2, the chief ray for the first horizontal edge area HL is directed toward the left side from the center area CT, the chief ray for the second horizontal edge area HR is directed toward the right side from the center area CT, the chief ray for the first vertical edge area VU is directed toward the top side from the center area CT, and the chief ray for the second vertical edge area VD is directed toward the bottom side from the center area CT. Furthermore, the chief ray for the first diagonal edge area DLU is directed toward the left top side from the center area CT, the chief ray for the second diagonal edge area DRD is directed toward the right bottom side from the center area CT, the chief ray for the third diagonal edge area DLD is directed toward the left bottom side from the center area CT, and the chief ray for the fourth diagonal edge area DRU is directed toward the right top side from the center area CT.

FIG. 3A schematically illustrates a cross-section of the pixel array 110, taken along a first cutting plane line A-A'. Therefore, the center area CT may be located in the center of the pixel array 110, the first horizontal edge area HL may be located on the left side of the center area CT, and the second horizontal edge area HR may be located on the right side of the center area CT.

The chief ray incident on the center area CT may be vertically incident on the top surface of the pixel array 110. That is, the incident angle of the chief ray incident on the center area CT may be 0° (or angle approximate to 0°).

However, the chief rays incident on the first horizontal edge area HL and the second horizontal edge area HR may be obliquely incident on the top surface of the pixel array 110. That is, the incident angle of each of the chief rays incident on the first and second horizontal edge areas HL and HR may correspond to a constant angle (angle larger than 0° and smaller than 90°). The constant angle may be changed according to the size of the pixel array 110, the curvature of the object lens 50, the distance between the object lens 50 and the pixel array 110 and the like.

The chief ray incident on the area between the center area CT and the first horizontal edge area HL may be obliquely incident on the top surface of the pixel array 110 as indicated by a left dotted line of FIG. 3A. However, the incident angle of the chief ray incident on the area between the center area CT and the first horizontal edge area HL may be smaller than the incident angle of the chief ray incident on the first horizontal edge area HL.

The chief ray incident on the area between the center area CT and the second horizontal edge area HR may be obliquely incident on the top surface of the pixel array 110 as indicated by a right dotted line of FIG. 3A. However, the incident angle of the chief ray incident on the area between the center area CT and the second horizontal edge area HR may be smaller than the incident angle of the chief ray incident on the second horizontal edge area HR.

FIG. 3A illustrates the cross-section of the pixel array 110, taken along the first cutting plane line A-A'. A cross-section of the pixel array 110, taken along a second cutting plane line B-B', may be identical or similar to the cross-section of the pixel array 110, taken along the first cutting plane line A-A', except that the cross-section of the pixel array 110, taken along the second cutting plane line B-B', includes the first vertical edge area VU and the second vertical edge area VD instead of the first horizontal edge area HL and the second horizontal edge area HR.

Figure 3B:
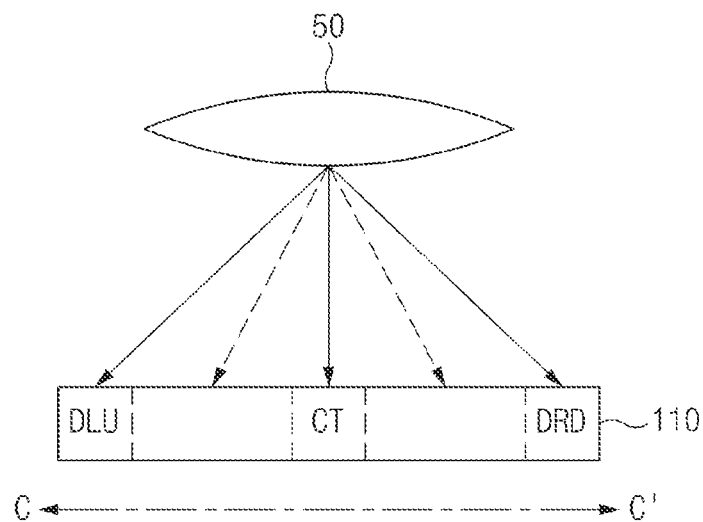
FIG. 3B is a diagram illustrating another example of light incident on the pixel array of FIG. 2.

FIG. 3B is a diagram illustrating another example of light incident on the pixel array of FIG. 2.

FIG. 3B schematically illustrates a cross-section of the pixel array 110, taken along a third cutting plane line C-C'. Therefore, the center area CT may be located in the center of the pixel array 110, the first diagonal edge area DLU may be located on the left side of the center area CT, and the second diagonal edge area DRD may be located on the right side of the center area CT.

The chief ray incident on the center area CT may be vertically incident on the top surface of the pixel array 110. That is, the incident angle of the chief ray incident on the center area CT may be 0° (or angle approximate to 0°).

However, the chief rays incident on the first diagonal edge area DLU and the second diagonal edge area DRD may be obliquely incident on the top surface of the pixel array 110. That is, the incident angle of the chief rays incident on the first and second diagonal edge areas DLU and DRD may correspond to a constant angle (angle larger than 0° and smaller than 90°). The constant angle may be changed according to the size of the pixel array 110, the curvature of the object lens 50, the distance between the object lens 50 and the pixel array 110 and the like.

The chief ray incident on the area between the center area CT and the first diagonal edge area DLU may be obliquely incident on the top surface of the pixel array 110 as indicated by a left dotted line of FIG. 3B. However, the incident angle of the chief ray incident on the area between the center area CT and the first diagonal edge area DLU may be smaller than the incident angle of the chief ray incident on the first diagonal edge area DLU.

The chief ray incident on the area between the center area CT and the second diagonal edge area DRD may be obliquely incident on the top surface of the pixel array 110 as indicated by a right dotted line of FIG. 3B. However, the incident angle of the chief ray incident on the area between the center area CT and the second diagonal edge area DRD may be smaller than the incident angle of the chief ray incident on the second diagonal edge area DRD.

FIG. 3B illustrates the cross-section of the pixel array 110, taken along the third cutting plane line C-C'. A cross-section of the pixel array 110, taken along a fourth cutting plane line D-D', may be identical or similar to the cross-section of the pixel array 110, taken along the third cutting plane line C-C', except that the cross-section of the pixel array 110, taken along a fourth cutting plane line D-D', includes the third diagonal edge area DLD and the fourth diagonal edge area DRU instead of the first diagonal edge area DLU and the second diagonal edge area DRD.

Figure 4A:
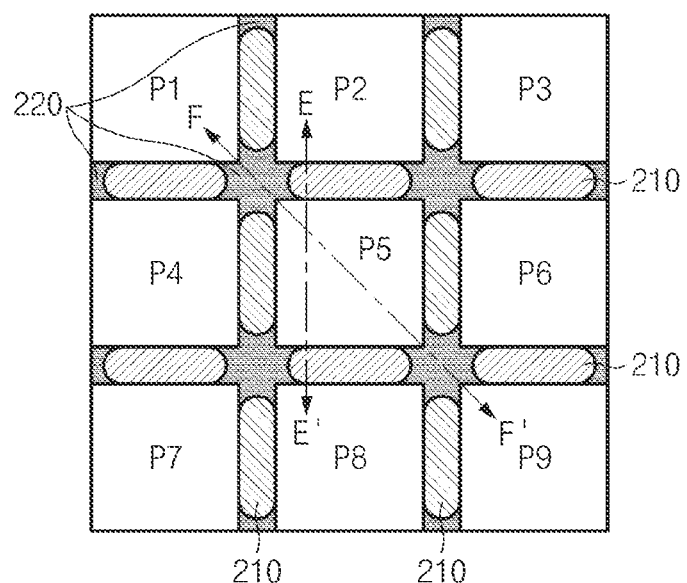
FIG. 4A is a diagram illustrating an example of a center area illustrated in FIG. 2.

FIG. 4A is a diagram illustrating an example of the center area illustrated in FIG. 2.

Referring to FIG. 4A, the center area 400A is an example of the center area CT illustrated in FIG. 2. In this patent document, a 3×3 array of nine pixels in the center area 400A will be discussed as an example.

The center area 400A may include nine pixels P1 to P9 arranged in a 3×3 matrix shape. Here, it should be noted that the consecutive numbers given to the pixels P1 to P9 do not indicate specific pixels within the pixel array 110, but indicate pixels disposed at specific positions in the 3×3 matrix.

The image sensor array shown in FIG. 4A may be structured to include a first grid structure 210 serving as a structure for optical isolation to optically isolate a pixel from an adjacent pixel such that the pixels P1 to P9 as shown in the center area 400A are physically separated by the first grid structure 210 to provide optical isolation between the pixels. The first grid structure 210 may include a low-index layer with a refractive index less than its surroundings to cause optical reflection for incident light at slanted angles (including incident light at large slanted angles that are totally reflected by the first grid structure 210) as further explained in the examples in FIGS. 8 and 10. In some implementations, the low index layer of the first grid structure 210 may include an air layer, a structure that is filled with air. In an embodiment of the disclosed technology, the first grid structure 210 may have a double-layer structure of an air layer and a metal layer filled with metal (e.g., tungsten) as further explained in examples below.

The first grid structure 210 may be defined as a component included in pixels adjacent to the first grid structure 210, or a component included in the pixel array 110 for distinguishing between pixels adjacent to the first grid structure 210. Each of the pixels P1 to P9 illustrated in FIG. 4A may indicate a light receiving area on which light can be incident.

In implementations, the first grid structure 210 may be disposed between the pixels (e.g., between P1 and P2, between P2 and P3) adjacent to each other in the row direction of the pixel array 110 or between the pixels (for example, P1 and P4, P4 and P7 and the like) adjacent to each other in the column direction (or top-to-bottom direction) of the pixel array 110. The first grid structures 210 may be arranged in the row or column direction of the pixel array 110. The first grid structure 210 may extend along one side of a pixel abutting the first grid structure 210. The first grid structure 210 extended along one side of the pixel may have a length equal to or less than the length of one side of the corresponding pixel.

The first grid structures 210 surrounding the center of the pixels (e.g., P1, P2, P4 and P5) arranged in a 2×2 matrix array are isolated from each other.

As illustrated in FIG. 4A, each of the first grid structures 210 extending in a direction may have round-shaped ends. The round-shaped ends of adjacent first grid structures 210 may be arranged to face each other. Such a round structure may advantageously disperse stress applied to the air layer included in the first grid structure 210 due to high temperature, thereby enhancing the structural stability of the first grid structure 210. In another embodiment of the disclosed technology, at least one surface of each of the first grid structures 210 may have a round structure.

A gap between adjacent first grid structures 210 arranged in the row direction of the center area 400A and a gap between adjacent first grid structures 210 arranged in the column direction of the center area 400A may be defined as a gap area 220. In some implementations, the gap area 220 does not include the low-index layer such as the air layer discussed above. That is, the gap areas 220 may be arranged in the row or column direction of the center area 400A, and may physically isolate air layers (or other low-index layers) of the first grid structures 210 from adjacent air layers. In an embodiment of the disclosed technology, a second grid structure including a metal layer may be disposed in the gap area 220. In some implementations, the gap area 220 includes a metal layer.

In some implementations, the first grid structure 210 may be consecutively disposed even in the gap areas 220 such that the entire air layers 240 of the pixel array 110 are connected to form a mesh type first grid structure 210.

In some implementations, since first and second capping films 250 and 260 are thin films and may be damaged due to the limitations of the fabrication process and environmental factors such as high pressure and temperature conditions. For example, the first and second capping films 250 and 260 may include specific spots where the first and second capping films 250 and 260 are thinner or weaker that other area, and the pressure applied to such weak points increases as the temperature and volume of the internal air of the air layer 240 increase. In the mesh-type structure in which the entire air layers 240 of the pixel array 110 are connected, the pressure corresponding to the volume of the entire air layers 240 of the pixel array 110 may be applied to the weak points. Thus, popping may easily occur at the weak points.

In the grid structure implemented based on some embodiments of the disclosed technology, the air layers 240 of different first grid structures 210 are physically separated, or a group of first grid structures 210 share a common air layer 240 and the air layers 240 of different group of first grid structures are physically separated by the gap area 220 including no air layer 240. Therefore, the pressure that would have increased in proportion to the entire volume of the air layer 240 of the first grid structure 210 may decrease by separating the air layers 240.

Figure 5:
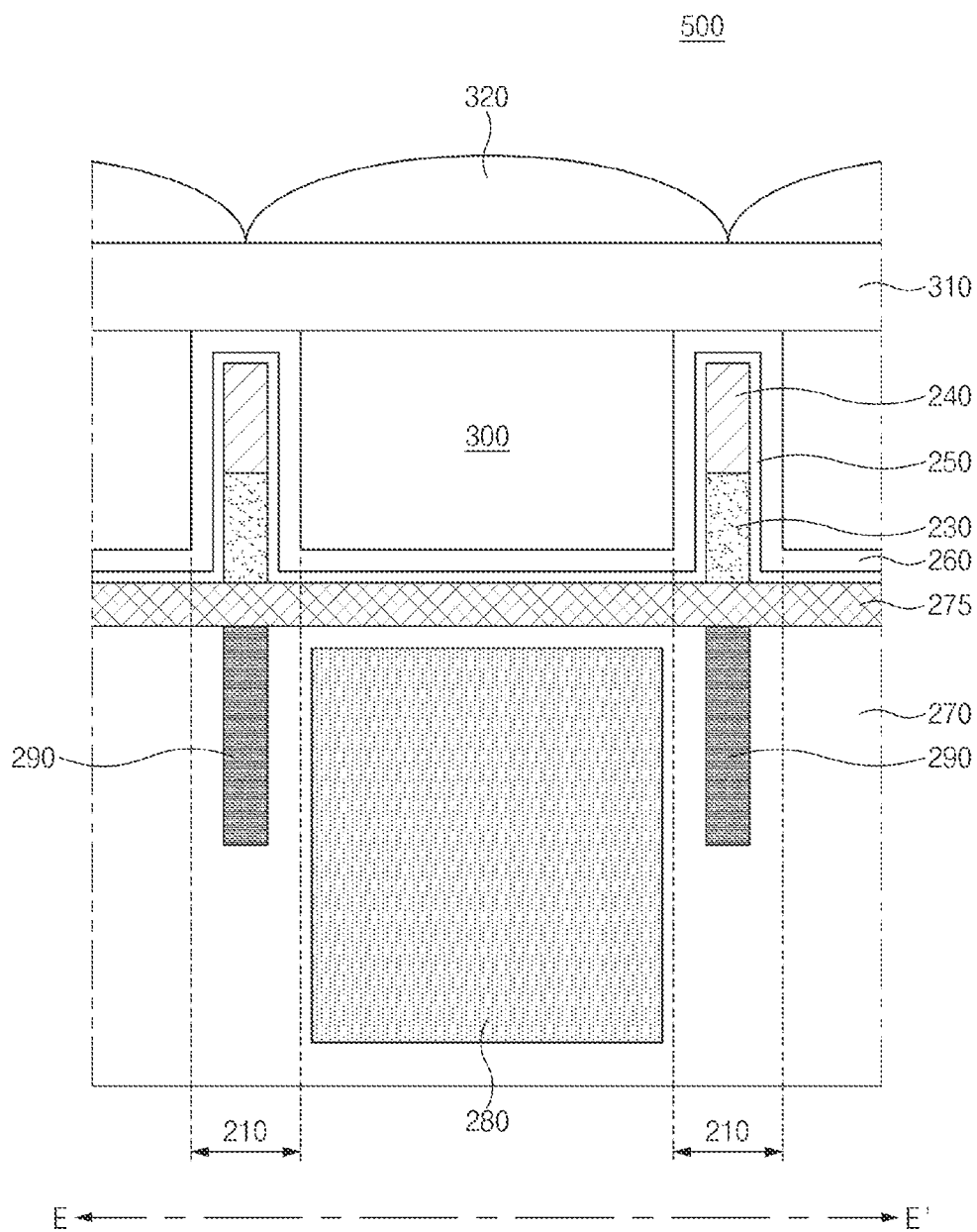
FIG. 5 is a diagram illustrating an example of a cross-section of the center area, taken along a cutting plane line illustrated in FIG. 4A.
Figure 6:
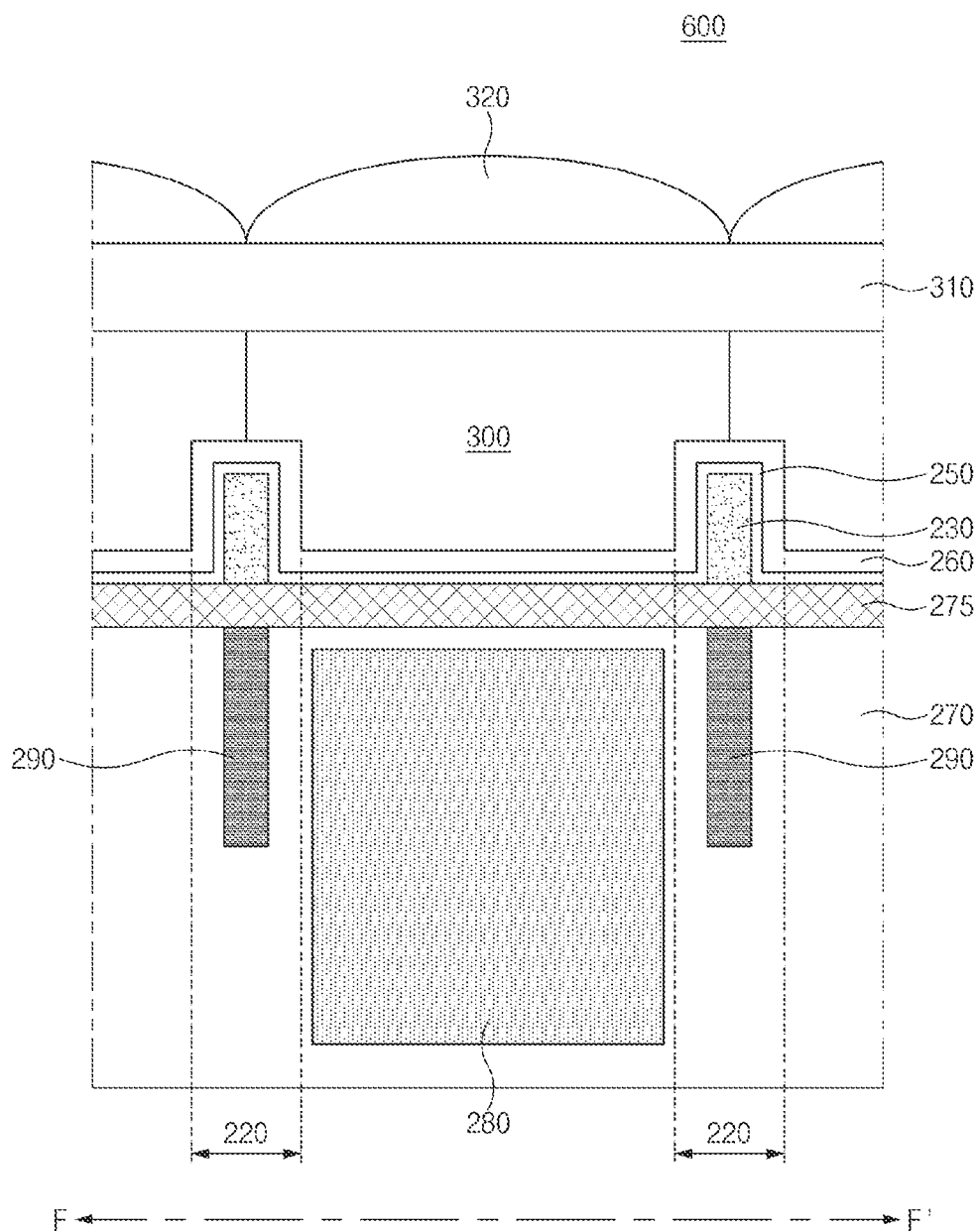
FIG. 6 is a diagram illustrating an example of a cross-section of the center area, taken along a cutting plane line illustrated in FIG. 4A.

FIG. 4A illustrates a fifth cutting plane line E-E' and a sixth cutting plane line F-F', and the structure of the pixel including the first grid structure 210 and the gap area 220 are illustrated in FIGS. 5 and 6, respectively, as will be discussed below.

In FIG. 4A, the center area 400A is illustrated as a center of a 3×3 pixel array, but any area in the pixel array 110 may correspond to the structure of the center area 400A. As described below, however, the positions or shapes of the first grid structures 210 may vary depending on relative positions within the pixel array 110.

Figure 4B:
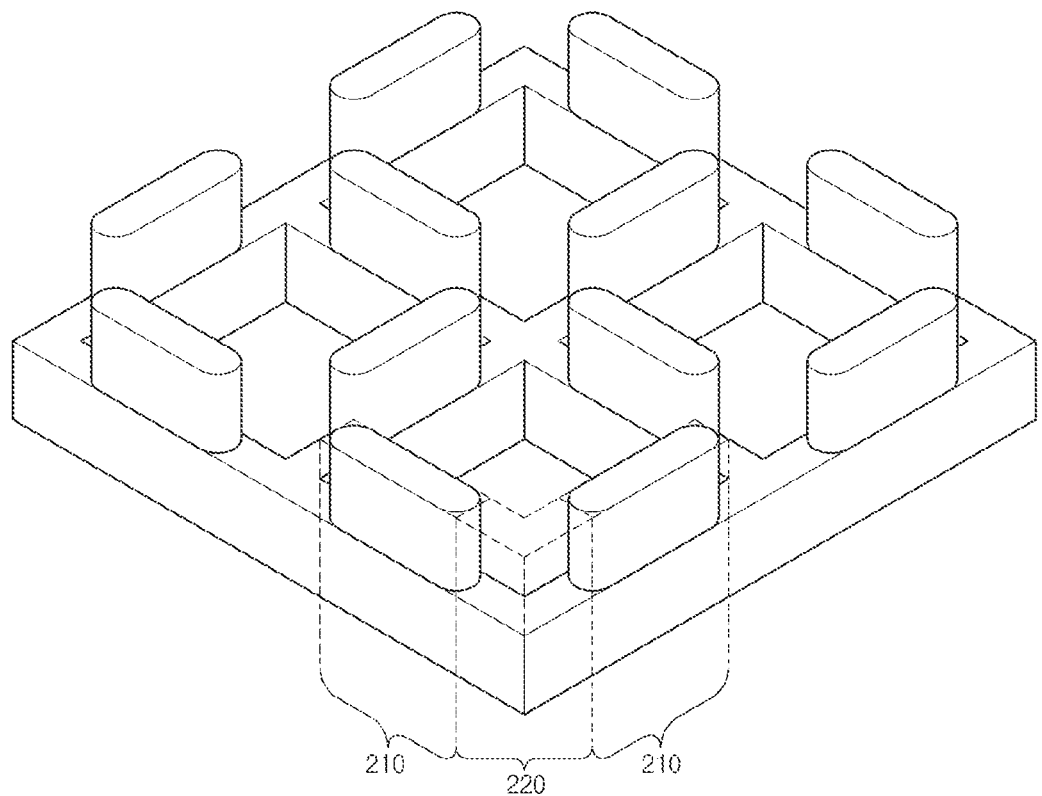
FIG. 4B is a perspective view of the center area illustrated in FIG. 4A.

FIG. 4B is a perspective view of the center area illustrated in FIG. 4A.

FIG. 4B illustrates the center area 400A corresponding to an example in which the second grid structure including a metal layer is disposed in the gap area 220.

The first grid structure 210 may include a low-index layer such as an air layer disposed over a metal layer to form a stack of low-index and metal layers. The gap area 220 may include a second grid structure corresponding to the lower metal layer without the air layer thereon. Thus, the gap area 220 may physically isolate the air layers of the first grid structures 210 adjacent to the gap area 220.

FIG. 5 is a diagram illustrating an example of a cross-section of the center area taken along the fifth cutting plane line illustrated in FIG. 4A.

FIG. 5 illustrates a cross-section 500 taken along the fifth cutting plane line E-E' of FIG. 4A. That is, the cross-section 500 taken along the fifth cutting plane line E-E' indicates cross-sections of the fifth pixel P5 and parts of the second and eighth pixels P2 and P8 located on the top and bottom sides of the fifth pixel P5. The structures of the pixels other than the fifth pixel P5 may also identical or similar to the fifth pixel P5.

The cross-section 500 taken along the fifth cutting plane line E-E' may include a substrate 270, an anti-reflection layer 275, a photoelectric conversion element 280, an isolation film 290, a metal layer 230, an air layer 240, a first capping film 250, a second capping film 260, a color filter 300, an over coating layer 310 and a micro lens 320.

The substrate 270 may include a top surface and a bottom surface which face each other. The bottom surface and the top surface of the substrate 270 may be defined as a front side and a back side, respectively, but the scope of the disclosed technology is not limited thereto. The substrate 270 may include a P-type or N-type bulk substrate, a substrate obtained by growing a P-type or N-type epitaxial layer in a P-type bulk substrate, or a substrate obtained by growing a P-type or N-type epitaxial layer in an N-type bulk substrate.

The anti-reflection layer 275 may be disposed on the substrate 270, and compensate for a difference in refractive index between the substrate 270 and the color filter 300, thereby reducing the reflectance of light directed toward the substrate 270. To this end, the anti-reflection layer 275 may have a refractive index value between the refractive index value of the substrate 270 and the refractive index value of the color filter 300.

The photoelectric conversion element 280 may be disposed in an area of the substrate 270, corresponding to the fifth pixel P5. The photoelectric conversion element 280 may generate and accumulate photocharges corresponding to the intensity of light incident on the fifth pixel P5. The photoelectric conversion element 280 may be implemented as at least one of a photodiode, a pin-type photodiode, a photo gate and a photo transistor. The photoelectric conversion element 280 may be formed as an N-type doping area through an ion implantation process of implanting N-type ions. According to an embodiment, the photoelectric conversion element 280 may have a structure in which a plurality of doping areas are stacked. In this case, a lower doping area may be formed by implanting N+ ions, and an upper doping area may be formed by implanting N− ions. The photoelectric conversion element 280 may be formed across as large an area as possible, in order to raise a fill factor indicating light receiving efficiency.

The isolation film 290 may be disposed between the photoelectric conversion elements 280 of pixels adjacent to each other, and may be recessed in a vertical direction in order to electrically and optically isolate the photoelectric conversion elements 280. For example, the isolation film 290 may be formed by filling a trench with a dielectric material, where the trench is vertically and deeply recessed through a DTI (Deep Trench Isolation) process.

The metal layer 230 may be disposed over the substrate 270. The metal layer 230 may be formed of a metallic material (e.g., tungsten) having a high light absorptivity. In an embodiment of the disclosed technology, the metal layer 230 may be formed by stacking different materials.

The air layer 240 may be disposed over the metal layer 230, and the shape of the air layer 240 may be defined by the first capping film 250. The air layer 240 may be filled with air having a relatively low refractive index (e.g., 1).

The first capping film 250 may be formed to cover the entire air layer 240 and the entire metal layer 230. That is, the first capping film 250 may be contacted with side surfaces of the air layer 240 and the metal layer 230 and the top surface of the air layer 240. Therefore, the air layer 240 and the metal layer 230 may be physically isolated from the outside by the first capping film 250. For example, the first capping film 250 may be ULTO (Ultra-Low Temperature Oxide) such as silicon oxide ($SiO_2$).

The second capping film 260 may be formed to cover the entire first capping film 250. That is, one surface of the second capping film 260 may be contacted with the first capping film 250, and the other surface of the second capping film 260 may be contacted with the outside of the first grid structure 210. Therefore, the first capping film 250 may be physically isolated from the outside by the second capping film 260. For example, the second capping film 260 may be a dielectric film including one or more of silicon oxynitride ($Si_xO_yN_z$), silicon oxide ($Si_xO_y$) and silicon nitride ($Si_xN_y$) where x, y and z are natural numbers.

The second capping film 260 may have a larger thickness than the first capping film 250. This is because the first capping film 250 is formed as thin as possible, so that an internal material can be effectively discharged to the outside during a plasma process for forming the air layer 240, and the second capping film 260 is formed to have a thickness required for stably maintaining the shape of the first grid structure 210 including the air layer 240.

The air layer 240 may be formed through a series of processes of forming a sacrificial film, including an SOC (Spin On Carbon) film containing carbon, at a position corresponding to the air layer 240, disposing the first capping film 250 to cover the sacrificial film, and then performing a plasma process using gas including at least one of oxygen, nitrogen and hydrogen. Here, an $O_2$ plasma process will be taken as an example. During the $O_2$ plasma process, oxygen radicals ($O^*$) are introduced into the sacrificial film through the first capping film 250, and combined with carbon of the sacrificial film to generate CO or $CO_2$. The generated CO or $CO_2$ escapes to the outside through the first capping film 250. Through such a process, the sacrificial film may be removed, and the air layer 240 may be formed at the position from which the sacrificial film has been removed.

In another embodiment of the disclosed technology, a support film for maintaining the shape of the first grid structure 210 may be formed in an area corresponding to the top of the air layer 240 and the bottom of the first capping film 250 included in the first grid structure 210. Such a support film may be a dielectric film having no light absorption characteristic.

In an embodiment of the disclosed technology, the first and second capping films 250 and 260 may include the same material, and have the same refractive index.

In an embodiment of the disclosed technology, the refractive index of each of the first and second capping films 250 and 260 may be higher than that of the air layer 240 and lower that of the color filter 300.

The first grid structure 210 may prevent light, incident on the color filter 300, from being directed to another adjacent color filter, thereby minimizing optical crosstalk.

Specifically, since the refractive index of the air layer 240 filled with air is lower than the refractive index (e.g., 1.6 to 1.7) of the color filter (not illustrated) and the refractive index (e.g., 1.4) of each of the first and second capping films 250 and 260, the air layer 240 may induce reflection to reflect incident light into the fifth pixel P5.

Although reflection by the air layer 240 does not occur but some incident light is refracted into the air layer 240 depending on various incident angles, the incident light may be absorbed by the metal layer 230, which makes it possible to prevent optical crosstalk.

As illustrated in FIG. 5, the height of the top surface of the color filter 300 may be equal to the height of the first grid structure 210. In other implementations, the height of the top surface of the color filter 300 may be larger or smaller than the height of the first grid structure 210.

Although FIG. 5 illustrates that the first grid structure 210 has a double-layer structure in which the metal layer 230 and the air layer 240 are stacked, the first grid structure 210 may have a single-layer structure which includes only the air layer 240 without the metal layer 230.

The first and second capping films 250 and 260 constituting the first grid structure 210 disposed on one side of the color filter 300 may be extended between the color filter 300 and the substrate 270, and disposed under the color filter 300. The first and second capping films 250 and 260 disposed under the color filter 300 may be connected to the first and second capping films 250 and 260 constituting the first grid structure 210 disposed on the other side of the color filter 300. That is, the first and second capping films 250 and 260 constituting the first grid structure 210 abutting the color filter 300 may be incorporated into one structure together with the first and second capping films 250 and 260 disposed under the color filter 300.

Therefore, the first and second capping films 250 and 260 for maintaining the shape of the first grid structure 210 may be contacted with another component (e.g., the substrate 270) across a larger area than when the first and second capping films 250 and 260 are not disposed under the color filter 300. Thus, the structural stability of the first grid structure 210 can be improved. The balance between tensions generated by the first and second capping films 250 and 260 disposed under the color filters 300 on the left and right sides of the first grid structure 210 may prevent the first grid structure 210 with a small width from tilting to the left or right.

The first and second capping films 250 and 260 disposed under the color filter 300 may function as the anti-reflection layer which compensates for a difference in refractive index between the color filter 300 and the substrate 270, such that light passing through the color filter 300 can be effectively directed toward the substrate 270. Therefore, although a separate anti-reflection layer is not provided between the color filter 300 and the substrate 270, the first and second capping films 250 and 260 may function as the anti-reflection layer. Thus, the entire thickness of the fifth pixel P5 may be reduced.

The color filter 300 may be formed on the substrate 270, and selectively transmit light at a specific wavelength range (e.g., red, green, blue, magenta, yellow, cyan or the like). In an embodiment of the disclosed technology, the color filter 300 may be omitted or replaced with an IR (Infrared Ray) pass filter, when the fifth pixel P5 corresponds to a depth pixel.

The over coating layer 310 may be disposed over the color filter 300 and the first grid structure 210, and prevent diffused reflection of light incident, thereby suppressing a flare characteristic. Furthermore, the over coating layer 310 may compensate for differences in height between the color filter 300 and the first grid structure 210, such that the micro-lens 320 has a constant height.

The micro lens 320 may be formed on the over coating layer 310, and increase light gathering power for incident light, thereby improving the light receiving efficiency of the photoelectric conversion element 280.

FIG. 6 is a diagram illustrating an example of a cross-section of the center area taken along the sixth cutting plane line illustrated in FIG. 4A.

FIG. 6 illustrates a cross-section 600 taken along the sixth cutting plane line F-F' of FIG. 4A. That is, the cross-section 600 taken along the sixth cutting plane line F-F' indicates cross-sections of the fifth pixel P5 and parts of the first and ninth pixels P1 and P9 located at the top and bottom sides of the fifth pixel P5. The following descriptions will be focused on the cross-section of the fifth pixel P5, but the other pixels included in the pixel array 110 may also have substantially the same structure.

The cross-section 600 taken along the sixth cutting plane line F-F' may include the substrate 270, the anti-reflection layer 275, the photoelectric conversion element 280, the isolation film 290, the metal layer 230, the first capping film 250, the second capping film 260, the color filter 300, the over coating layer 310 and the micro lens 320.

The cross-section 600 taken along the sixth cutting plane line F-F' shows that the gap area 200 has a structure in which the air layer 240 is omitted from the first grid structure 210. That is, the gap area 220 may be defined as the second grid structure including the metal layer 230.

According to another embodiment, when the first grid structure 210 has a single structure including only the air layer 240 without the metal layer 230, the gap area 220 may not include the metal layer 230.

Over the gap area 220, the boundary between the color filters 300 of different unit pixels (e.g., P2 and P1) may be located.

Figure 7:
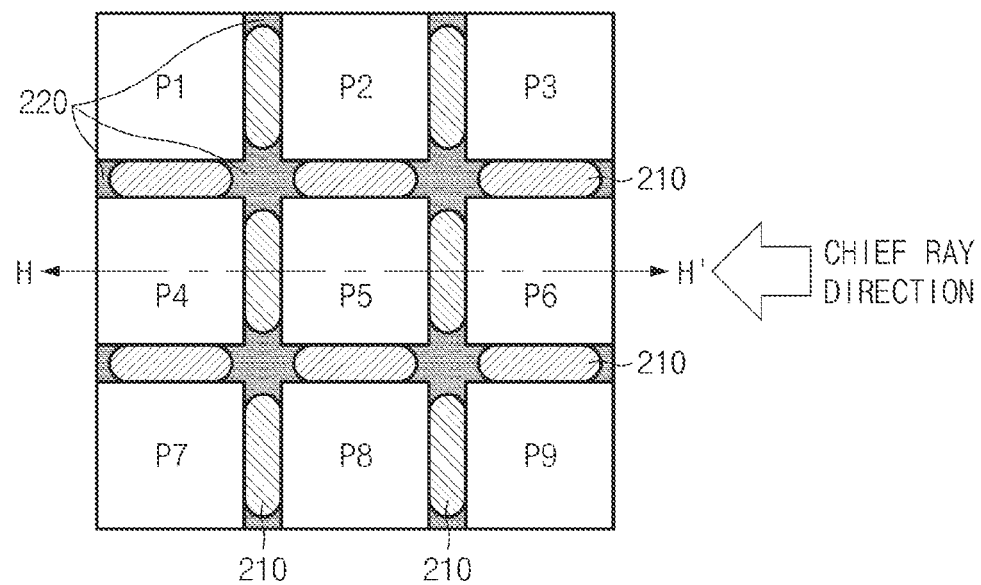
FIG. 7 is a diagram illustrating an embodiment of a first horizontal edge area illustrated in FIG. 2.

FIG. 7 is a diagram illustrating an embodiment of the first horizontal edge area illustrated in FIG. 2.

Referring to FIG. 7, a first horizontal edge area 700 is an example of the first horizontal edge area illustrated in FIG. 2. In this patent document, a 3×3 array of nine pixels in the first horizontal edge area 700 will be taken as an example for description.

The first horizontal edge area 700 may include nine pixels P1 to P9 arranged in a 3×3 matrix shape. Here, it should be noted that the numbers given to the pixels P1 to P9 do not indicate specific pixels within the pixel array 110, but indicate pixels disposed at specific positions in the 3×3 matrix.

The first horizontal edge area 700 may include the first grid structures 210 and the gap areas 220 which are structures for optical isolation between the pixels P1 to P9 adjacent to one another. In some implementations, the positions and structures of the first grid structures 210 and the gap areas 220 are substantially the same as the positions and structures of the first grid structures 210 and the gap areas 220.

As described with reference to FIG. 3A, chief ray incident on the first horizontal edge area 700 propagates to the left from the right of the first horizontal edge area 700, when seen from the top. The direction of the chief ray incident on the first horizontal edge area 700 is defined as a first incident direction.

Figure 8:
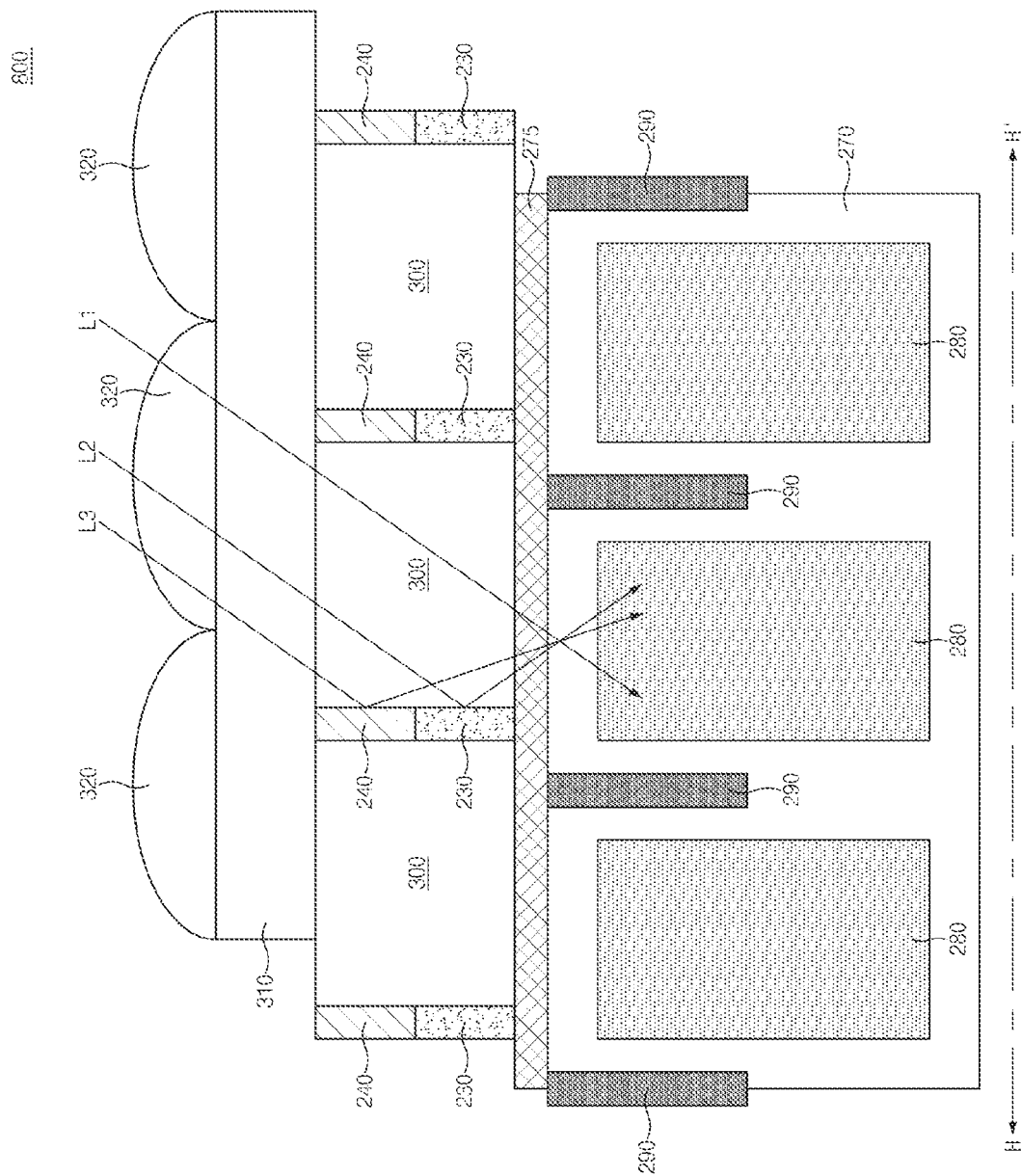
FIG. 8 is a diagram illustrating an example of a cross-section of the first horizontal edge area, taken along a cutting plane line illustrated in FIG. 7.

FIG. 7 illustrates a seventh cutting plane line H-H' for cutting the pixels P4 to P6 adjacent to each other in the first incident direction in which the chief ray propagates. Referring to FIG. 8, the incident path of the chief ray will be described as follows.

FIG. 8 is a diagram illustrating an example of a cross-section of the first horizontal edge area taken along the seventh cutting plane line illustrated in FIG. 7.

FIG. 8 illustrates a cross-section 800 taken along the seventh cutting plane line H-H' of FIG. 7. That is, the cross-section 800 taken along the seventh cutting plane line H-H' indicates a cross-section of the pixels P4 to P6 adjacent to each other in the first incident direction. The following descriptions will be focused on the cross-section of the pixels P4 to P6. However, other pixels P1 to P3 or P7 to P9 adjacent to each other in the first incident direction within the first horizontal edge area 700 may have substantially the same structure.

The cross-section 800 taken along the seventh cutting plane line H-H' may include the substrate 270, the anti-reflection layer 275, the photoelectric conversion element 280, the isolation film 290, the metal layer 230, the air layer 240, the color filter 300, the over coating layer 310 and the micro lens 320.

In some implementations, the structures, functions and materials of the components included in the cross-section 800 are substantially the same as those of the components described with reference to the cross-section 500 of FIG. 5. Unlike the structure of FIG. 5, the first and second capping films 250 and 260 are omitted in FIG. 8, for convenience of description. It should be noted that the first and second capping films 250 and 260 may be included in the same manner as in FIG. 5.

The cross-section 800 may be divided into a first layer including the micro-lens 320 and the over coating layer 310, a second layer including the metal layer 230, the air layer 240 and the color filter 300, and a third layer including the substrate 270, the anti-reflection layer 275, the photoelectric conversion element 280 and the isolation film 290.

In the cross-section 500 of FIG. 5, the first layer, the second layer and the third layer may be disposed so that a vertical line passing through the boundary between the micro-lenses 320 adjacent to each other in the first layer, a vertical line passing through the center of the metal layer 230 or the air layer 240 in the second layer, and a vertical line passing through the center of the isolation film 290 in the third layer substantially coincide with another other. In other words, the first layer, the second layer and the third layer may be disposed so that the optical axis of the micro-lens 320, i.e. a vertical line passing through the center of the micro-lens 320, a vertical line passing through the center of the color filter 300, and a vertical line passing through the center of the photoelectric conversion element 280 substantially coincide with one another.

In the first horizontal edge area 700, however, the chief ray is obliquely incident on the top surface of the first layer. Thus, the second layer may be shifted with respect to the first layer, and the third layer may be shifted with respect to the second layer, such that the chief ray having passed through the micro-lens 320 of the fifth pixel P5 passes through the color filter 300 of the fifth pixel P5 and is incident on the photoelectric conversion element 280 of the fifth pixel P5. That is, the vertical line passing through the center of the metal layer 230 or the air layer 240 at the second layer may be shifted by a predetermined distance in the propagation direction (left in FIG. 8) of the chief ray with respect to the vertical line passing through the boundary between the micro-lenses 320 adjacent to each other. Furthermore, the vertical line passing through the center of the isolation film 290 at the third layer may be shifted by a predetermined distance in the propagation direction of the chief ray with respect to the vertical line passing through the center of the metal layer 230 or the air layer 240 at the second layer. The distance by which the second layer is shifted with respect to the first layer and the distance by which the third layer is shifted with respect to the second layer may be experimentally determined to minimize crosstalk between pixels while maximizing the light receiving efficiency. Furthermore, the distance by which the second layer is shifted with respect to the first layer and the distance by which the third layer is shifted with respect to the second layer may be equal to or different from each other.

In the area disposed between the first horizontal edge area 700 and the center area CT, the distance by which the second layer is shifted with respect to the first layer and the distance by which the third layer is shifted with respect to the second layer may be gradually increased from the center area CT toward the first horizontal edge area 700. This is because the incident angle of the chief ray increases from the center area CT toward the first horizontal edge area 700.

In this patent document, the chief ray effectively incident on the fifth pixel P5 can have a range from first ray L1 to third ray L3. When the chief ray is effectively incident, it may indicate that the chief ray is incident on the photoelectric conversion element 280 of the fifth pixel P5.

The first ray L1 may be incident on the photoelectric conversion element 280 through the color filter 300, the anti-reflection layer 275 and the substrate 270.

The second ray L2 may be incident on the color filter 300, reflected by the metal layer 230 (more specifically, the first and second capping films 250 and 260 covering the metal layer 230), and incident on the photoelectric conversion element 280 through the color filter 300, the anti-reflection layer 275 and the substrate 270.

The third ray L3 may be incident on the color filter 300, reflected by the air layer 240, and incident on the photoelectric conversion element 280 through the color filter 300, the anti-reflection layer 275 and the substrate 270.

The third ray L3 which is the outermost light ray on one side (i.e. left side), among the chief rays which are effectively incident on the fifth pixel P5, may be reflected by the air layer 240 disposed on the left side of the color filter 300, and incident on the photoelectric conversion element 280 of the fifth pixel P5. Furthermore, the first ray L1 which is the outermost light ray on the other side (i.e. right side), among the chief rays which are effectively incident on the fifth pixel P5, may be incident through the micro-lens 320 of the fifth pixel P5 and incident on the photoelectric conversion element 280 of the fifth pixel P5 through an opening defined by the air layer 240 disposed on the right side of the color filter 300.

Therefore, the range of the chief ray which is effectively incident on the fifth pixel P5 may be determined based on the opening defined by the air layers 240 disposed on both sides of the fifth pixel P5 in the direction of the chief ray. In other words, the chief ray which is effectively incident on the fifth pixel P5 may interact with the air layers 240. That is because the air layers 240 are disposed in the propagation direction of the chief ray.

In FIGS. 7 and 8, the first horizontal edge area 700 has been taken as an example for description. However, substantially the same technical idea may be applied to the second horizontal edge area HR, the first vertical edge area VU and the second vertical edge area VD, except that the second layer and the third layer are shifted in a different direction according to the direction of the chief ray. That is, the range of chief ray which is effectively incident on each of the pixels in the second horizontal edge area HR, the first vertical edge area VU and the second vertical edge area VD may be determined based on an opening defined by the air layers 240 disposed on both sides of the pixels in the direction of the chief ray.

Figure 9:
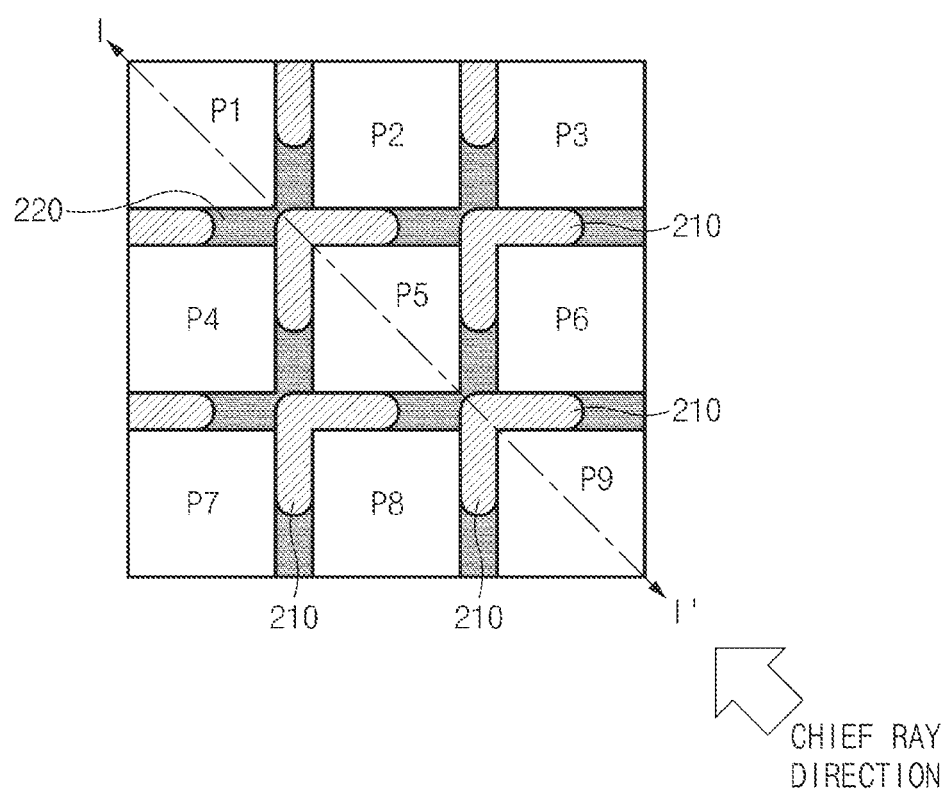
FIG. 9 is a diagram illustrating an example of a first diagonal edge area illustrated in FIG. 2.

FIG. 9 is a diagram illustrating an example of the first diagonal edge area illustrated in FIG. 2.

Referring to FIG. 9, a first diagonal edge area 900 is an example of the first diagonal edge area VLU illustrated in FIG. 2. In this patent document, a 3×3 array of nine pixels in the first diagonal edge area 900 will be taken as an example for description, for convenience of description.

The first diagonal edge area 900 may include nine pixels P1 to P9 arranged in a 3×3 matrix shape. Here, it should be noted that the consecutive numbers given to the pixels P1 to P9 do not indicate specific pixels within the pixel array 110, but indicate pixels disposed at specific positions in the 3×3 matrix.

The first diagonal edge area 900 may include the first grid structures 210 and the gap areas 220 which are structures for optical isolation between the pixels P1 to P9 adjacent to one another.

In this example, the first grid structure 210 included in the first diagonal edge area 900 may have a bent shape such as an L-shape to cover the left corner or the left top part a pixel near the corresponding vertex of the pixel (for example, P5). The first grid structure 210 may be physically isolated from the first grid structure 210 adjacent thereto.

The entire length of the first grid structure 210 having a bent shape such as an L-shape may be changed according to the position of the corresponding pixel. For example, the entire length of the first grid structure 210 may be decreased as the position of the pixel within the first diagonal edge area DLU becomes close to the left top vertex of the pixel array 110. This is because, since the direction of the chief ray gets close to the left top vertex of the corresponding pixel as the position of the pixel becomes close to the left top vertex of the pixel array 110, the optical uniformity can be maintained even though the entire length of the first grid structure 210 is decreased. Furthermore, as the entire length of the first grid structure 210 is decreased, the volume of the air layer 240 can be reduced to further prevent popping at a weak point.

As described with reference to FIG. 3B, chief ray incident on the first diagonal edge area 900 propagates to the left top from the right bottom of the first diagonal edge area 900, when seen from the top. The direction of the chief ray incident on the first diagonal edge area 900 is defined as a second incident direction.

Figure 10:
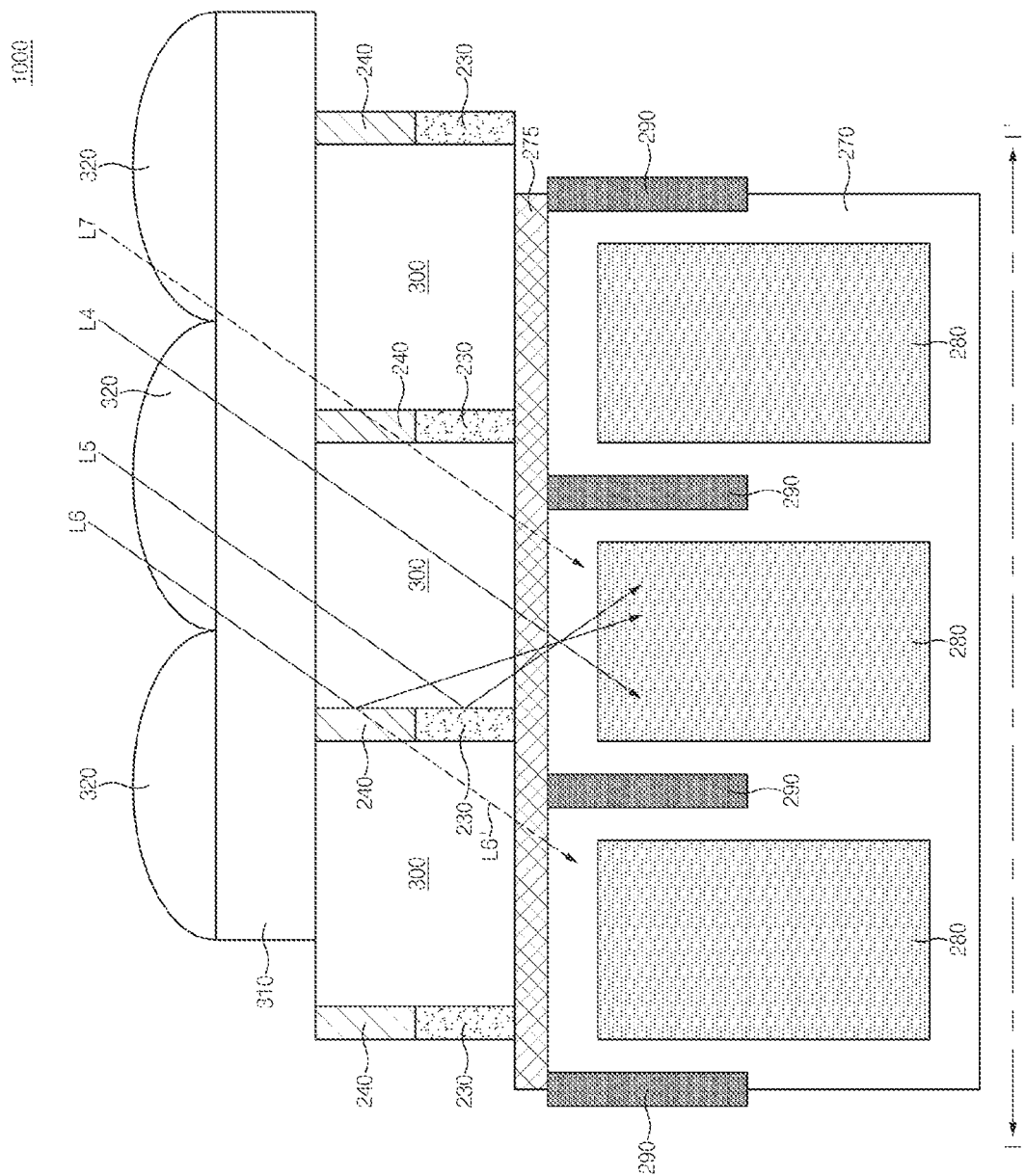
FIG. 10 is a diagram illustrating an example of a cross-section of the first diagonal edge area, taken along a cutting plane line illustrated in FIG. 9.

FIG. 9 illustrates an eighth cutting plane line I-I' for cutting the pixels P1, P5 and P9 adjacent to each other in the second incident direction in which the chief ray propagates. Referring to FIG. 10, the incident path of the chief ray will be described as follows.

FIG. 9 illustrates the first grid structure 210 included in the first diagonal edge area 900. However, the first grid structure 210 of the second diagonal edge area DRD may have a bent shape such as an L-shape to cover the right bottom vertex of each pixel, the first grid structure 210 of the third diagonal edge area DLD may have a bent shape such as an L-shape to cover the left bottom vertex of each pixel, and the first grid structure 210 of the fourth diagonal edge area DRU may have a bent shape such as an L-shape to cover the right top vertex of each pixel.

That is, a direction facing the vertex of the pixel covered by the L-shaped first grid structure 210 from the center of the pixel included in any one of the first to fourth diagonal edge areas DLU, DRD, DLD and DRU may correspond to a direction facing the diagonal edge area including the pixel, among the first to fourth diagonal edge areas DLU, DRD, DLD and DRU, from the center area CT of the pixel array 110.

For example, a direction facing the right top vertex covered by the first grid structure 210 from the center of the pixel included in the fourth diagonal edge area DRU may correspond to a direction facing the fourth diagonal edge area DRU including the corresponding pixel from the center area CT.

FIG. 10 is a diagram illustrating an example of a cross-section of the first diagonal edge area taken along the eighth cutting plane line illustrated in FIG. 9.

FIG. 10 illustrates a cross-section 1000 taken along the eighth cutting plane line I-I' of FIG. 9. That is, the cross-section 1000 taken along the eighth cutting plane line I-I' indicates a cross-section of the pixels P1, P5 and P9 adjacent to each other in the second incident direction. The following descriptions will be focused on the cross-section of the pixels P1, P5 and P9. However, other pixels (for example, P4 and P8) adjacent to each other in the second incident direction within the first diagonal edge area 900 may have substantially the same structure.

The cross-section 1000 taken along the eighth cutting plane line I-I' may include the substrate 270, the anti-reflection layer 275, the photoelectric conversion element 280, the isolation film 290, the metal layer 230, the air layer 240, the color filter 300, the over coating layer 310 and the micro lens 320.

In some implementations, the structures, functions and materials of the components included in the cross-section 1000 are substantially the same as those of the components described with reference to the cross-section 500 of FIG. 5. Unlike the structure of FIG. 5, the first and second capping films 250 and 260 are omitted from FIG. 10, for convenience of description. It should be noted that the first and second capping films 250 and 260 may be included in the same manner as FIG. 5.

Like the structure illustrated in FIG. 8, chief ray is obliquely incident on the top surface of the first layer in the first diagonal edge area 900. Thus, in the cross-section 1000, the second layer may be shifted with respect to the first layer, and the third layer may be shifted with respect to the second layer, such that the chief ray having passed through the micro-lens 320 of the fifth pixel P5 passes through the color filter 300 of the fifth pixel P5 and is incident on the photoelectric conversion element 280 of the fifth pixel P5. The distance by which the second layer is shifted with respect to the first layer and the distance by which the third layer is shifted with respect to the second layer may be experimentally determined to minimize crosstalk between pixels while maximizing the light receiving efficiency. Furthermore, the distance by which the second layer is shifted with respect to the first layer and the distance by which the third layer is shifted with respect to the second layer may be equal to or different from each other.

In the area disposed between the first diagonal edge area 900 and the center area CT, the distance by which the second layer is shifted with respect to the first layer and the distance by which the third layer is shifted with respect to the second layer may be gradually increased from the center area CT toward the first diagonal edge area 900. This is because the incident angle of the chief ray increases from the center area CT toward the first diagonal edge area 900.

In this patent document, the chief ray effectively incident on the fifth pixel P5 can have a range from fourth ray L4 to sixth ray L6. When the chief ray is effectively incident, it may indicate that the chief ray is incident on the photoelectric conversion element 280 of the fifth pixel P5.

The fourth ray L4 may be incident on the photoelectric conversion element 280 through the color filter 300, the anti-reflection layer 275 and the substrate 270.

The fifth ray L5 may be incident on the color filter 300, reflected by the metal layer 230 (more specifically, the first and second capping films 250 and 260 covering the metal layer 230), and incident on the photoelectric conversion element 280 through the color filter 300, the anti-reflection layer 275 and the substrate 270.

The sixth ray L6 may be incident on the color filter 300, reflected by the air layer 240, and incident on the photoelectric conversion element 280 through the color filter 300, the anti-reflection layer 275 and the substrate 270.

The sixth ray L6 which is the outermost light on one side (i.e. left side), among the chief rays which are effectively directed toward the fifth pixel P5, may be reflected by the air layer 240 disposed on the left side of the color filter 300, and incident on the photoelectric conversion element 280 of the fifth pixel P5. Furthermore, the fourth ray L4 which is the outermost light on the other side (i.e. right side), among the chief rays which are effectively directed toward the fifth pixel P5, may be incident through the micro-lens 320 of the fifth pixel P5 and incident on the photoelectric conversion element 280 of the fifth pixel P5 through an opening defined by the air layer 240 disposed on the right side of the color filter 300.

Therefore, the range of the chief ray which is effectively incident on the fifth pixel P5 may be determined based on the opening defined by the air layers 240 disposed on both sides of the fifth pixel P5 in the direction of the chief ray. In other words, the chief ray which is effectively directed toward the fifth pixel P5 may interact with the air layers 240. That is because the air layers 240 are disposed in the propagation direction of the chief ray.

In FIGS. 9 and 10, the first diagonal edge area 900 has been taken as an example for description. However, substantially the same technical idea may be applied to the second diagonal edge area DRD, the third diagonal edge area DLD and the fourth diagonal edge area DRU, except that the second layer and the third layer are shifted in a different direction according to the direction of the chief ray. That is, the range of chief ray which is effectively directed toward each of the pixels in the second diagonal edge area DRD, the third diagonal edge area DLD and the fourth diagonal edge area DRU may be decided by the opening defined by the air layers 240 disposed on both sides of each of the pixels in the direction of the chief ray.

This may indicate that the range of the chief ray which is effectively directed toward each of the pixels of the diagonal edge areas is substantially the same as the range of the chief ray which is effectively directed toward each of the pixels of the horizontal or vertical edge areas described with reference to FIG. 8. Furthermore, in the diagonal edge areas and the horizontal or vertical edge areas, the range of the chief ray which is effectively incident on each of the pixels may be the substantially the same as the range of the chief ray incident on the micro-lens 320 of each of the pixels.

Even in the center area CT, the range of the chief ray which is effectively incident on each of the pixels is substantially the same as the range of the chief ray incident on the micro-lens 320 of each of the pixels. This is because the incident angle of the chief ray corresponds to 0° (or angle approximate to 0°). Furthermore, the range of the chief ray which is effectively directed toward each of the pixels in the center area CT may be determined based on an opening defined by the air layers 240 disposed on both sides of each of the pixels in the direction of the chief ray.

Therefore, as the shape and position of the air layer of each pixel are changed according to the direction of the chief ray with respect to the pixel while the air layer of the pixel is separately disposed, the optical uniformity across the entire pixel array 110 can be guaranteed.

Unlike the embodiments of FIGS. 9 and 10, suppose that the first grid structures 210 in the entire pixel array 110 have the same position and shape. That is, suppose that the first grid structure 210 illustrated in FIG. 7 is disposed even in the first diagonal edge area VLU.

In this case, the cross-section taken along the eighth cutting plane line I-I' may not include the air layer 240, unlike the cross-section of FIG. 10.

Therefore, the chief ray which is effectively directed toward the fifth pixel P5 may have a range from the fifth ray L5 to the seventh ray L7, not a range from the fourth ray L4 to the sixth ray L6.

That is, when there is no air layer 240, the sixth ray L6' may be incident on the color filter 300 of the fifth pixel P5, may pass through an area corresponding to the air layer 240 and may be directed toward the photoelectric conversion element 280 of the first pixel P1 through the color filter 300, the anti-reflection layer 275 and the substrate 270 of the first pixel P1. This indicates that the sixth ray L6' becomes the chief ray which is effectively directed toward the first pixel P1, not the chief ray which is effectively directed toward the fifth pixel P5.

When there is no air layer 240, the seventh ray L7 may be incident on the color filter 300 of the ninth pixel P9 through the micro-lens 320 of the ninth pixel P9, may pass through an area corresponding to the air layer 240, and may be directed toward the photoelectric conversion element 280 of the fifth pixel P5 through the color filter 300, the anti-reflection layer 275 and the substrate 270 of the fifth pixel P5. This indicates that the seventh ray L7 becomes the chief ray which is effectively directed toward the fifth pixel P5, not the chief ray which is effectively directed toward the ninth pixel P9.

That is, based on the comparison above, the range of the chief ray which is effectively directed toward the fifth pixel P5 may be decided by an opening defined by the metal layers 230 disposed on both sides of the fifth pixel P5 in the direction of the chief ray. In other words, the chief ray which is effectively directed toward the fifth pixel P5 may interact with the metal layer 230. That is because the air layers 240 are not disposed in the propagation direction of the chief ray.

In this case, as described above, the range of the chief ray which is effectively incident may be different from the case in which the air layers 240 are disposed, and the optical uniformity across the entire the pixel array 110 may be degraded. The degradation in optical uniformity of the pixel array 110 may act as serious noise for an image generated from the pixel array 110.

Figure 11:
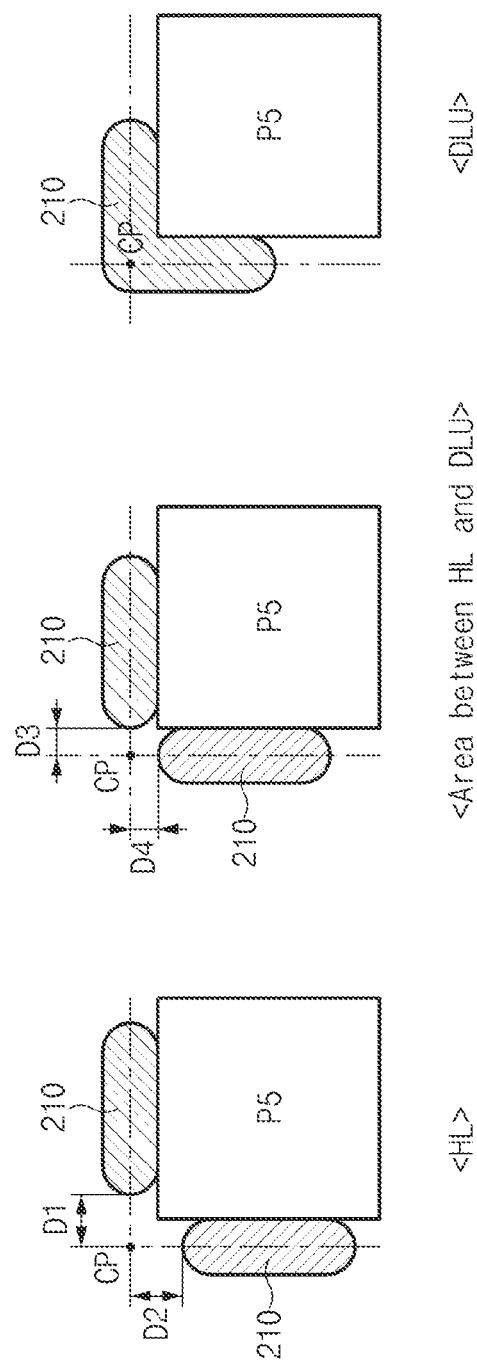
FIG. 11 is a diagram schematically illustrating an example of a first grid structure, which has different shapes depending on its location in the pixel array of FIG. 2.

FIG. 11 is a diagram schematically illustrating an example of the first grid structure, which has different shapes depending on its location in the pixel array of FIG. 2.

FIG. 11 illustrates the positions and shapes of the first grid structures 210 in the first horizontal edge area HL, the area between the first horizontal edge area HL and the first diagonal edge area DLU, and the first diagonal edge area DLU. In FIG. 11, a cross point CP may correspond to an intersection between a horizontal line passing through the center of the first grid structure 210 disposed on the top side of the fifth pixel P5 and a vertical line passing through the center of the first grid structure 210 disposed on the left side of the fifth pixel P5.

In the first horizontal edge area HL on the left side of FIG. 11, the first grid structure 210 disposed on the top side of the fifth pixel P5 may be spaced a first distance D1 apart from the cross point CP. The first grid structure 210 disposed on the left side of the fifth pixel P5 may be spaced a second distance D2 apart from the cross point CP.

In the area between the first horizontal edge area HL and the first diagonal edge area DLU in the center of FIG. 11, the first grid structure 210 disposed on the top side of the fifth pixel P5 may be spaced a third distance D3 apart from the cross point CP. The first grid structure 210 disposed on the left side of the fifth pixel P5 may be spaced a fourth distance D4 apart from the cross point CP. The third distance D3 may be smaller than the first distance D1, and the fourth distance D4 may be smaller than the second distance D2.

From the first horizontal edge area HL toward the first diagonal edge area DLU, the direction of the chief ray may be gradually changed from the left toward the left top. In this case, the first grid structure 210 disposed on the top side of the fifth pixel P5 and the first grid structure 210 disposed on the left side of the fifth pixel P5 may be gradually moved so as to be disposed close to the cross point CP, such that the range of the chief ray which is effectively directed toward the fifth pixel P5 can be decided by the opening defined by the air layers 240 disposed on both sides of the fifth pixel P5 in the direction of the chief ray, or the optical uniformity can be maintained.

According to an embodiment, as the first grid structure 210 disposed on the top side of the fifth pixel P5 and the first grid structure 210 disposed on the left side of the fifth pixel P5 are gradually moved so as to be disposed close to the cross point CP, the length of the first grid structure 210 disposed on the top side of the fifth pixel P5 and the length of the first grid structure 210 disposed on the left side of the fifth pixel P5 may be reduced. This is in order to omit the first grid structure 210 corresponding to an area irrelevant to the chief ray, as the direction of the chief ray is gradually changed from the left toward the left top. Furthermore, as the length of the first grid structure 210 is reduced, the volume of the air layer 240 can be reduced to further prevent popping at a weak point.

From the first horizontal edge area HL toward the first diagonal edge area DLU, the third and fourth distances D3 and D4 may be gradually reduced. In the first horizontal edge area HL on the right side of FIG. 11, the first grid structure 210 disposed on the top side of the fifth pixel P5 and the first grid structure 210 disposed on the left side of the fifth pixel P5 may be merged to have a bent shape such as an L-shape to cover the left top vertex.

As the position of the pixel within the first diagonal edge area DLU gets close to the left top vertex of the pixel array 110 after the first grid structures 210 are merged to have a bent shape such as an L-shape, the entire length of the first grid structure 210 may be reduced. This is because, since the direction of the chief ray is close to the left top vertex of the corresponding pixel as the position of the pixel becomes close to the left top vertex of the pixel array 110, the optical uniformity can be maintained even though the entire length of the first grid structure 210 is reduced. Furthermore, as the entire length of the first grid structure 210 is reduced, the volume of the air layer 240 can be reduced to further prevent popping at a weak point.

In FIG. 11, the shape and position of the first grid structure 210 in the area between the first horizontal edge area HL and the first diagonal edge area DLU have been described. However, the same technical idea may be applied to the first grid structures 210 which are disposed in a random horizontal or vertical edge area and disposed in an area between diagonal edge areas disposed on the left/right or top/bottom sides thereof.

For example, the first grid structure 210 in the second vertical edge area VD may be substantially the same as that of the first horizontal edge area HL of FIG. 11. From the second vertical edge area VD toward the second diagonal edge area DRD, the first grid structures 210 disposed on the bottom and right sides of each pixel may be gradually moved so as to be disposed close to each other. In the second diagonal edge area DRD, the first grid structure 210 may have a bent shape such as an L-shape to cover the right bottom vertex.

That is, from a first area, which is any one of the first horizontal edge area HL, the second horizontal edge area HR, the first vertical edge area VU and the second vertical edge area VD, toward a diagonal edge area adjacent to the first area, the position of the first grid structure 210 may become gradually close to the vertex where the L-shaped first grid structure included in the diagonal edge area adjacent to the first area is located.

In FIG. 11, the shape and position of the first grid structure 210 which are changed from the horizontal or vertical edge area toward the diagonal edge area have been described. However, the shape and position of the first grid structure 210 may be similarly changed from the center area CT toward the diagonal edge area. This is in order that the incident angle of the chief ray is gradually increased so that the range of the chief ray which is effectively directed toward each of the pixels can be decided by an opening defined by the air layers 240 disposed on both sides of the pixel in the direction of the chief ray, or the optical uniformity can be maintained.

For example, the first grid structure 210 in the center area CT may be substantially the same as that of the first horizontal edge area HL of FIG. 11. From the center area CT toward the third diagonal edge area DLD, the first grid structures 210 disposed on the bottom and left sides of each pixel may be gradually moved so as to be disposed close to each other. In the third diagonal edge area DLD, the first grid structure 210 may have a bent shape such as an L-shape to cover the left bottom vertex.

Therefore, the position and shape of the first grid structure 210 which covers a random pixel included in the pixel array 110 may be decided by the direction and incident angle of the chief ray incident on the pixel.

The first to fourth diagonal edge areas DLU, DRD, DLD and DRU correspond to areas where the direction of the chief ray corresponds to a first or second diagonal direction, and the incident angle of the chief ray is relatively large. The position and shape of the first grid structure 210 to cover a random pixel may be similar to those of the first grid structure 210 of the diagonal edge area which is the closest among the first to fourth diagonal edge areas DLU, DRD, DLD and DRU, as the direction of the chief ray is close to the first or second diagonal direction and the incident angle of the chief ray increases.

Based on the present embodiment, the first grid structures 210 implemented separately from each other may be disposed on both sides of a pixel abutting on the first grid structures 210 in the direction of the chief ray incident on the pixel, thereby providing the optical uniformity of the pixel array 110.

In this patent document, the separate first grid structure 210 including the air layer 240 has been taken as an example for description. However, the technical idea of this patent document may be applied to a random separate-type grid structure.

While various embodiments have been described above as specific examples for implementing those embodiments, variations and modifications of those embodiments and other embodiments can be made based on what is disclosed and illustrated in this patent document.

What is claimed is:

1. An image sensing device comprising:
an image sensing pixel array including a plurality of image sensing pixels operable to respond to light and to produce imaging pixel signals; and
a plurality of first grid structures disposed between image sensing pixels to separate adjacent image sensing pixels,
wherein the image sensing pixel array is structured to include a center area located at or near a center of the image sensing pixel array, first and second diagonal edge areas disposed on opposite sides of the center area in a first diagonal direction, and third and fourth diagonal edge areas disposed on opposite sides of the center area in a second diagonal direction that is different from the first diagonal direction,
wherein a length of each of the first grid structures in the center area is smaller than a length of a corresponding side of a corresponding image sensing pixel,
wherein each of the plurality of first grid structures in the first to the fourth diagonal edge areas includes a bent portion to cover one vertex and adjacent parts of each image sensing pixel to separate the imaging pixel from adjacent image sensing pixels,
wherein each of the plurality of first grid structures includes a low index layer having a refractive index lower than a refractive index of surroundings,
wherein the low index layer of the bent portion in the first grid structure corresponding to a first image sensing pixel in one of the first to fourth diagonal edge areas is physically isolated from the low index layer of the bent portion in the first grid structure corresponding to a second image sensing pixel adjacent to the first image sensing pixel,
wherein each of the plurality of first grid structures in the first to the fourth diagonal edge areas is in contact with three image sensing pixels,
wherein the first grid structures located in the center region are symmetrically located on four sides of each image sensing pixel, and
wherein the bent portion of a first grid structure in the first to fourth diagonal edge areas covers only one vertex of each image sensing pixel that is farthest from the center region and portions of adjacent sides of the vertex.

2. The image sensing device of claim 1, wherein the low index layer includes a structure filled with air.

3. The image sensing device of claim 1, wherein each of the first grid structures includes an L-shaped structure disposed at a vertex of the image sensing pixel.

4. The image sensing device of claim 3, wherein the center area further comprises a second grid structure disposed between the first grid structure to physically isolate the first grid structures from each other.

5. The image sensing device of claim 4, wherein the second grid structure includes a material layer different from the low-index layer.

6. The image sensing device of claim 3, wherein a length of each of the first grid structures in the center area is smaller than a length of the corresponding side of the image sensing pixel.

7. The image sensing device of claim 1, wherein each of the first grid structures further comprises a first capping film configured to cover the low-index layer.

8. The image sensing device of claim 7, wherein the first capping film has a higher refractive index than the low-index layer, and a lower refractive index than a color filter abutting the first grid structure.

9. The image sensing device of claim 7, wherein each of the first grid structures further comprises a second capping film configured to cover the first capping film and having a larger thickness than the first capping film.

10. The image sensing device of claim 7, wherein each of the first grid structures further comprises a metal layer disposed under the low-index layer and formed of metal.

11. The image sensing device of claim 1, wherein a direction facing a vertex of an image sensing pixel of the plurality of image sensing pixels that is surrounded by the first grid structure from a center of the image sensing pixel corresponds to a direction facing a diagonal edge area including the image sensing pixel among the first to fourth diagonal edge areas from the center area of the image sensing pixel array.

12. The image sensing device of claim 11, wherein the first diagonal edge area is disposed on a first side of the center area, and comprises an L-shaped first grid structure disposed at a first vertex of the image sensing pixel corresponding to the first side of the center area.

13. The image sensing device of claim 11, wherein the second diagonal edge area is disposed on a second side of the center area, and comprises an L-shaped first grid structure disposed at a second vertex of the image sensing pixel corresponding to the second side of the center area.

14. The image sensing device of claim 11, wherein the third diagonal edge area is disposed on a third side of the center area, and comprises an L-shaped first grid structure disposed a third vertex of the image sensing pixel corresponding to the third side of the center area.

15. The image sensing device of claim 11, wherein the fourth diagonal edge area is disposed on a fourth side of the center area, and comprises an L-shaped first grid structure disposed at a fourth vertex of the image sensing pixel corresponding to the fourth side of the center area.

16. The image sensing device of claim 1, wherein the image sensing pixel array further comprises first and second horizontal edge areas disposed on both sides of the center area along a horizontal line passing through the center area, and first and second vertical edge areas disposed on both sides of the center area along a vertical line passing through the center area, wherein the shapes and positions of the first grid structures included in the first and second horizontal edge areas and the first and second vertical edge areas, respectively, correspond to the shape and position of the first grid structure included in the center area.

17. The image sensing device of claim 16, wherein from any one area of the first horizontal edge area, the second horizontal edge area, the first vertical edge area and the second vertical edge area, toward the diagonal edge area adjacent to the any one area, the position of the first grid structure gradually gets close to the vertex where the first grid structure included in a diagonal edge area adjacent to the any one area is located.

\* \* \* \* \*